(12) United States Patent
Shen et al.

(10) Patent No.: US 9,473,122 B1
(45) Date of Patent: Oct. 18, 2016

(54) RAIL-TO-RAIL INPUT STAGE CIRCUIT WITH CONSTANT TRANSCONDUCTANCE

(71) Applicant: QUALCOMM Incorporated, San Diego, CA (US)

(72) Inventors: Liangguo Shen, San Diego, CA (US); Chunlei Shi, San Diego, CA (US); Hua Guan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/837,364

(22) Filed: Aug. 27, 2015

(51) Int. Cl.
  *H03L 5/00* (2006.01)
  *H03K 3/356* (2006.01)
  *G05F 3/26* (2006.01)

(52) U.S. Cl.
  CPC ......... *H03K 3/356104* (2013.01); *G05F 3/262* (2013.01)

(58) Field of Classification Search
  CPC ........... H03K 19/01852; H03K 3/356; H03K 19/018521; H03K 19/00315; H03K 17/102; H03K 3/012
  USPC .................. 327/306–333; 326/61–62, 80–81
  See application file for complete search history.

(56) References Cited

U.S. PATENT DOCUMENTS

| 6,535,030 B1 * | 3/2003 | Nix ..................... H03F 3/45753 327/562 |
| 8,102,211 B2 * | 1/2012 | Shi ....................... H03F 3/45183 330/258 |
| 8,680,922 B2 | 3/2014 | Wan |
| 8,773,174 B2 | 7/2014 | Wang et al. |
| 8,816,770 B2 * | 8/2014 | Pradhan ................ H03F 1/3211 330/253 |
| 2014/0111278 A1 | 4/2014 | Coimbra et al. |
| 2014/0176239 A1 | 6/2014 | Duggal |

* cited by examiner

*Primary Examiner* — Dinh T Le
(74) *Attorney, Agent, or Firm* — Haynes and Boone, LLP (57) ABSTRACT

Embodiments described herein relate to an improved circuit technique in a rail-to-rail input stage circuit utilizing non-complementary differential pairs with bias control designed to maintain a constant transconductance "gm" throughout an input common mode voltage range. The rail-to-rail input stage circuit comprises a first differential pair circuit, a level-shifted differential pair circuit coupled with the first differential pair circuit, and a constant transconductance generation circuit coupled with the level-shifted differential pair circuit. The constant transconductance generation circuit is configured to control the bias current conducting in the level-shifted differential pair circuit based on current conducting in the first differential pair circuit to maintain a constant transconductance in the rail-to-rail input stage circuit.

13 Claims, 8 Drawing Sheets

RAIL-TO-RAIL INPUT STAGE CIRCUIT WITH CONSTANT TRANSCONDUCTANCE

FIELD OF THE INVENTION

At least certain embodiments disclosed herein relate generally to electronics circuits, and more particularly to an improved rail-to-rail input stage circuit for use in analog or mixed signal circuits.

BACKGROUND

An input stage circuit is a basic building block for analog or mixed signal circuits. A first stage of an analog or mixed signal circuit may typically include an input stage circuit operating over a rail-to-rail ("rail-to-rail") input common mode voltage range. A rail-to-rail input stage circuit is designed to handle a wide input common mode voltage range. Typically the rail-to-rail input stage circuit is designed to handle an input common mode voltage ranging from negative supply voltage rail (or ground) all the way up to the positive supply voltage rail, hence the name rail-to-rail. Examples of such analog or mixed signal circuits include operational amplifiers, comparators, and analog-to-digital converters.

Figure 1:
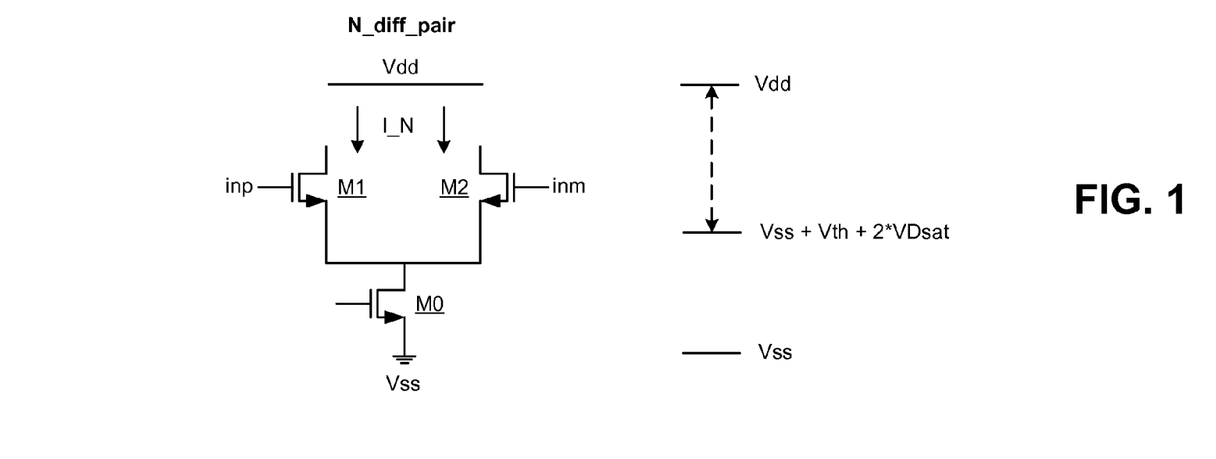
FIG. 1 depicts a typical N differential pair circuit according to the prior art.
Figure 2:
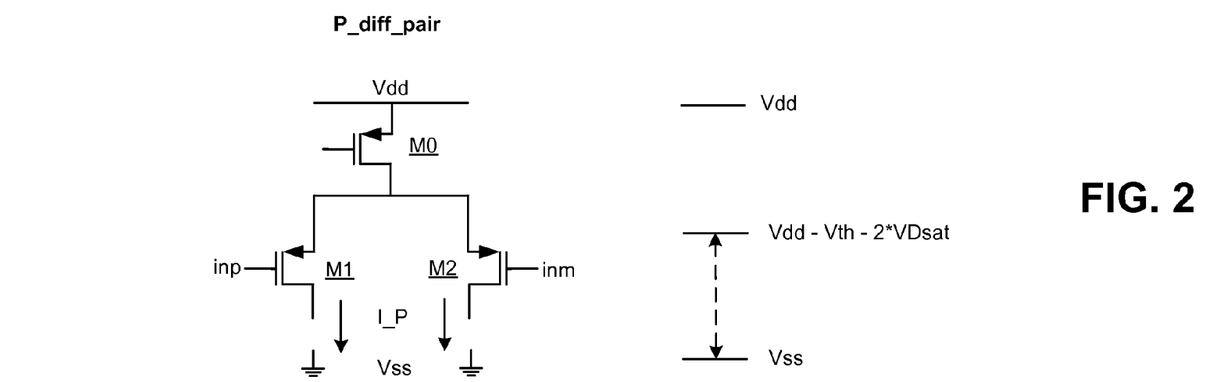
FIG. 2 depicts a typical P differential pair circuit according to the prior art.

Analog or mixed signal circuits used in low-voltage integrated circuit manufacturing processes normally require a differential input stage circuit that can operate when the input common mode voltage approaches the supply rails. Conventional rail-to-rail input stage circuits use two complimentary differential transistor pair circuits including a first differential pair circuit ("N_diff_pair") comprising a pair of matched N-type metal-oxide semiconductor ("NMOS") transistors and a second differential pair circuit ("P_diff_pair") comprising a pair of matched P-type metal-oxide-semiconductor ("PMOS") transistors. FIG. 1 depicts a typical N differential pair circuit and FIG. 2 depicts a typical P differential pair circuit according to the prior art.

The input common mode of differential pairs is limited. For the N_diff_pair, the input common mode is limited to the voltage range from $V_{SS}+V_{th}+2*V_{Dsat}$ to $V_{DD}$, where $V_{DD}$ is the positive supply voltage, $V_{SS}$ is the negative supply voltage (ground), $V_{th}$ is the threshold voltage of metal-oxide-semiconductor ("MOS") transistors M1 and M2, and $V_{Dsat}$ is the saturation voltage for MOS transistors M0, M1, and M2. For the P_diff_pair, the input common mode is limited to the voltage range from $V_{SS}$ to $V_{DD}-V_{th}-2*V_{Dsat}$. Thus, when $V_{DD}>V_{SS}+2*(V_{th}+2V_{Dsat})$, the combination of P_diff_pair and N_diff_pair can be used to support the entire common mode range from the negative supply voltage to the positive supply voltage.

Figure 3:
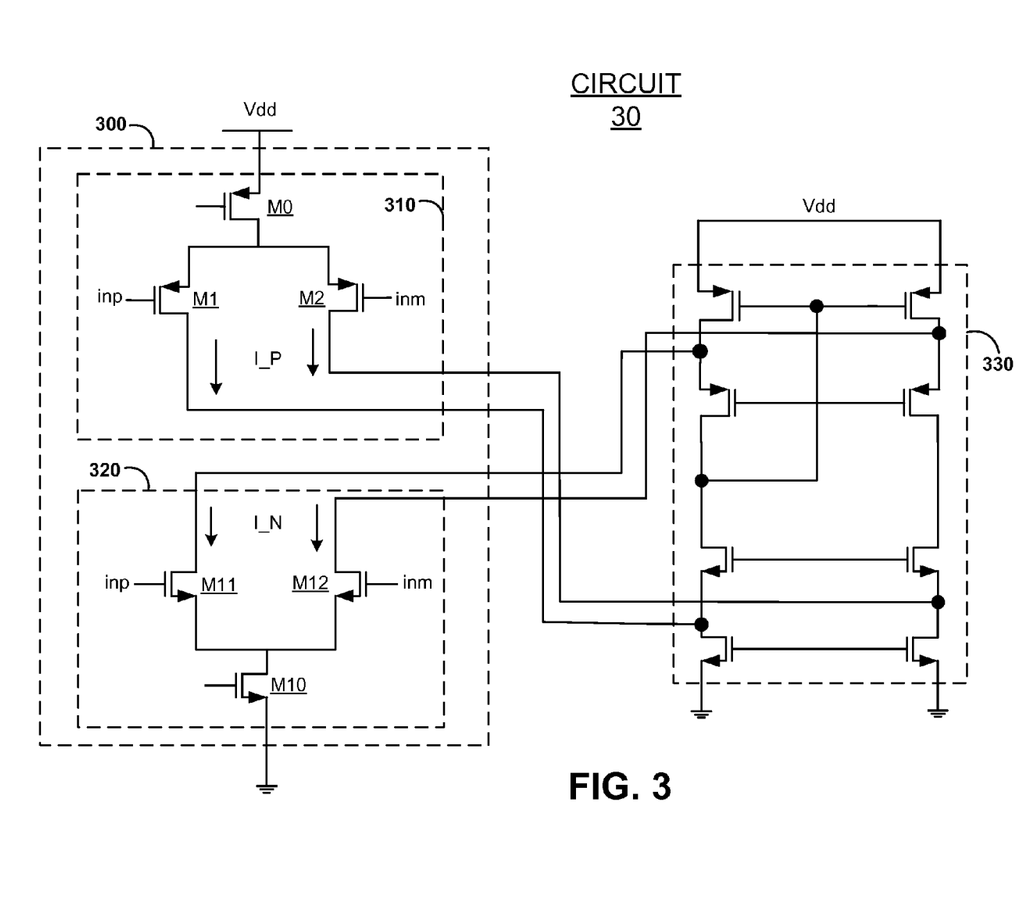
FIG. 3 depicts an example rail-to-rail input stage circuit utilizing complementary differential pairs of transistors according to the prior art.

FIG. 3 is an example of a rail-to-rail input stage circuit including complementary differential pairs of transistors according to the prior art. Rail-to-rail input stage circuit 30 includes first stage circuit 300 and second stage circuit 330. The first stage circuit 300 includes a first differential pair 310 and a second differential pair 320, where the first differential pair 310 is a P_diff_pair and the second differential pair 320 is an N_diff_pair, similar to the P_diff_pair and the N_diff_pair described FIGS. 1 and 2.

The rail-to-rail input stage circuit 30 shown in FIG. 3 is also known as a two-stage "folded cascode" amplifier since the second stage circuit 330 combines (folds) the current flowing through P_diff_pair 310 with the current flowing through the N_diff_pair 320. Because these currents inherently flow in opposite directions, the second stage circuit 330 is necessary to fold and sum the currents flowing through P_diff_pair 310 and N_diff_pair 320.

A drawback of rail-to-rail input stage circuit 30, which uses complementary differential pairs, is the requirement of a second stage circuit. The second stage circuit limits the bandwidth and operational speed of the rail-to-rail input stage circuit, and also requires additional die area. As a result, the bandwidth and speed of any circuit embodying this type of rail-to-rail input stage will also be limited. In addition, since both NMOS and PMOS devices are used, this solution is more sensitive to variations in the manufacturing process. Further it is a design challenge to optimize the design of rail-to-rail input stage circuit 30 to account for noise, power consumption, and/or speed.

More recently, rail-to-rail input stage circuits have been developed based on non-complementary differential pairs, which include two sets of the same type of differential pairs (NMOS or PMOS) to overcome the shortcomings of the rail-to-rail input stage circuits that use complementary differential pairs. One proposed solution using rail-to-rail input stage circuits based on non-complementary differential pairs is described in U.S. Pat. No. 8,102,211 to Shi ("Shi Patent"). The Shi Patent utilizes a dynamic bias control circuit that controls the bias current through the second differential pair circuit to maintain the output impedance of the rail-to-rail input stage circuit.

Figure 4:
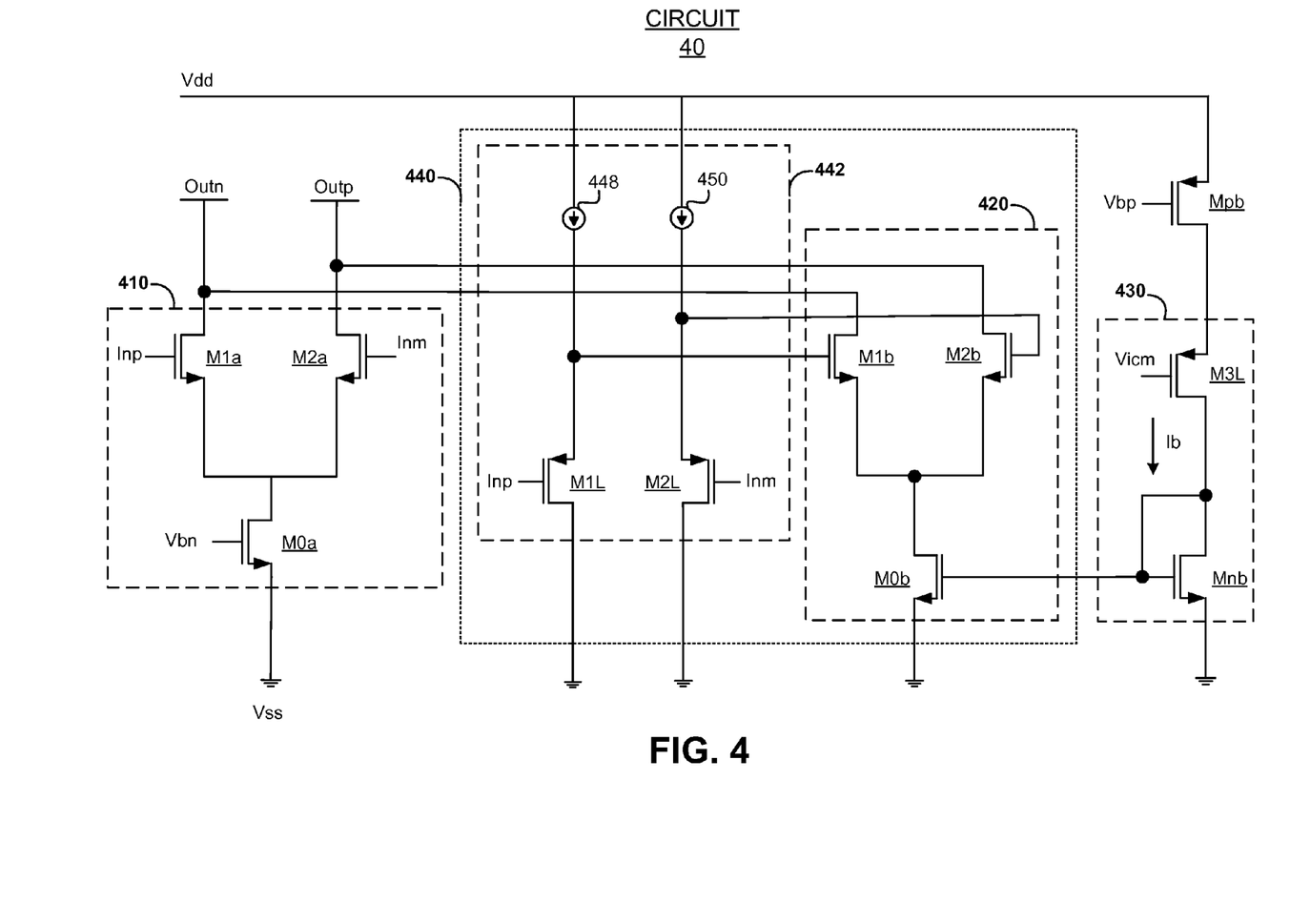
FIG. 4 depicts an example rail-to-rail input stage circuit utilizing non-complementary differential pairs with a dynamic bias control circuit according to the prior art.

FIG. 4 depicts an example rail-to-rail input stage circuit utilizing non-complementary differential pairs with a dynamic bias control circuit according to the prior art. It provides a differential pair circuit 410 coupled with a level-shifted differential pair circuit 440, and a bias control circuit 430. The differential pair circuit 410 and the level-shifted differential pair 440 include the same type of MOS devices, also known as non-complementary MOS devices. These MOS devices can be either NMOS or PMOS devices.

The bias control circuit 430 monitors the input common mode voltage ("$V_{icm}$") of the rail-to-rail input stage circuit and gradually reduces the bias current through the level-shifted differential pair 440; and eventually cuts it down to zero. The bias control circuit 430 includes MOS transistors M3L and Mnb. MOS transistor M3L functions as a voltage sensor that detects the input common mode voltage $V_{icm}$ of the rail-to-rail input stage circuit 40, and the MOS transistor Mnb functions as a current mirror that mirrors a tracking current "Ib" inversely proportional to $V_{icm}$ to the current source M0b of the level-shifted differential pair circuit 440. The current source Mpb provides the necessary bias current to the bias control circuit 430. The voltage sensor M3L is controlled by the input common mode voltage $V_{icm}$. When $V_{icm}$ is higher than $V_{DD}-V_{th}-V_{Dsat}$, the voltage sensor M3L detects this condition and generates a tracking current inversely proportional to the $V_{icm}$.

The differential pair circuit 410 includes a differential transistor pair of matched NMOS transistors M1a and M2a coupled with a current source transistor M0a. The level-shifted differential pair circuit 440 comprises a source follower circuit 442 coupled with a differential pair circuit 420. The source follower circuit 442 includes a pair of matched PMOS transistors M1L and M2L coupled with two bias current sources 448 and 450, respectively. The differential pair circuit 420 includes a differential transistor pair of matched NMOS transistors M1b and M2b and the current source transistor M0b discussed above.

In operation, the source follower circuit 442 shifts up the voltage level of the input signal at the input of the rail-to-rail input stage circuit 40. As a result, when $V_{icm}$ is outside the input common mode voltage range supported by the level-shifted differential pair circuit 440, the level-shifted differential circuit 440 does not affect the normal operation of differential pair circuit 410, and, therefore, the operation of the rail-to-rail input stage circuit 40. Bias control circuit 430 does not allow MOS transistors M1b and M2b to enter into the ohmic (linear) region, and thus does not allow reduction of the overall output impedance, and consequently the gain, of rail-to-rail input stage circuit 40.

The bias control scheme of the Shi Patent, however, is based on the assumption that $V_{DD}=2*(V_{th}+V_{DSAT})$. When $V_{DD}$ is much higher, both of the differential pairs 410 and 420 conduct current. As a result, the transconductance ("gm") is therefore not constant over the range of input common mode voltages. It is desirable to maintain constant transconductance over the range of input common mode voltages because constant transconductance makes frequency compensation much easier and more robust when a rail-to-rail input stage is used in a feedback network. Constant transconductance can also reduce the harmonic and variation in the circuit speed. Additionally the circuit technique disclosed in the Shi Patent cannot achieve constant gm without adding several levels of additional complex logic.

SUMMARY

Embodiments described herein relate to an improved circuit technique in a rail-to-rail input stage circuit utilizing non-complementary differential pairs with bias control designed to maintain a constant transconductance ("gm") throughout an input common mode voltage range. The rail-to-rail input stage circuit comprises a first differential pair circuit, a level-shifted differential pair circuit coupled with the first differential pair circuit, and a constant transconductance generation circuit coupled with the level-shifted differential pair circuit. The constant transconductance generation circuit is configured to control the bias current conducting in the level-shifted differential pair circuit based on current conducting in the first differential pair circuit to maintain a constant transconductance in the rail-to-rail input stage circuit.

The first differential pair circuit includes a first pair of matched transistors and a first current source transistor. The level-shifted differential pair circuit comprises a source follower circuit and a second differential pair circuit, and the second differential pair circuit comprises a second pair of matched transistors and a second current source transistor.

The constant transconductance generation circuit includes a current sensor circuit configured to generate a tracking current proportional to the bias current in the first differential pair, and a current mirror transistor including a transistor device having its gate and drain terminals coupled with the current sensor and the second current source transistor of the level-shifted differential pair to control the bias of current conducting in the second current source transistor of the level-shifted differential pair circuit in response to the tracking current.

The constant transconductance generation circuit is adapted to adjust current conducting in the second differential pair circuit to maintain the total current conducting in the first differential pair and the level-shifted differential pair substantially constant over the entail input common mode voltage range. Therefore the transconductance of the rail-to-rail input stage circuit can be maintained substantially constant. The first differential pair is the primary differential pair, which is fully turned on when the input common mode voltage is within the primary pair's common mode range. While the level-shifted differential pair is the secondary (auxiliary) differential pair, which is only turned on when the primary differential pair runs out of headroom (meaning the input common mode voltage is not high enough to fully turn on the first differential pair).

In another embodiment, a method in a rail-to-rail input stage circuit is described. The method includes receiving an input signal having a common mode voltage range at a first differential pair circuit having a first pair of matched transistors and a first current source transistor, and shifting up the voltage level of the input signal using a level-shifted differential pair circuit coupled with the first differential pair circuit, where the level-shifted differential pair circuit has an input common mode voltage range extending from a negative power supply voltage (or to ground) to a positive power supply voltage. The method further includes generating a substantially constant transconductance in the rail-to-rail input stage circuit using a constant transconductance generation circuit coupled with the level-shifted differential pair circuit, and controlling bias of current conducting in the level-shifted differential pair circuit based on current conducting in the first differential pair circuit.

In yet other embodiments, a circuit means for providing a constant transconductance in a rail-to-rail input stage circuit is described. The means includes a means for receiving an input signal having a common mode voltage range at a first differential pair circuit having a first pair of matched transistors and a first current source transistor, and a means for shifting up the voltage level of the input signal using a level-shifted differential pair circuit coupled with the first differential pair circuit, where the level-shifted differential pair circuit has an input common mode voltage range extending from a negative power supply voltage to a positive power supply voltage. The means further includes a means for generating a substantially constant transconductance in the rail-to-rail input stage circuit using a constant transconductance generation circuit coupled with the level-shifted differential pair circuit, and a means for controlling bias of current conducting in the level-shifted differential pair circuit based on current conducting in the first differential pair circuit.

The following detailed description and accompanying drawings provide a better understanding of the nature and advantages of the present invention.

BRIEF DESCRIPTION OF THE DRAWINGS

For a better understanding of at least certain embodiments, reference will be made to the following detailed description, which is to be read in conjunction with the accompanying drawings.

DETAILED DESCRIPTION

Throughout the description, for the purposes of explanation, numerous specific details are set forth in order to provide a thorough understanding of the present invention. It will be apparent to one skilled in the art, however, that the techniques described herein may be practiced without some of these specific details. In other instances, well-known structures and devices may be shown in block diagram form to avoid obscuring the underlying principles of the invention.

Provided below is a description of an example system upon which the embodiments described herein may be implemented. Although certain elements may be depicted as separate components, in some instances one or more of the components may be combined into a single device or system. Likewise, although certain functionality may be described as being performed by a single element or component within the system, the functionality may in some instances be performed by multiple components or elements working together in a functionally coordinated manner.

I. Exemplary Circuit

Figure 5A:
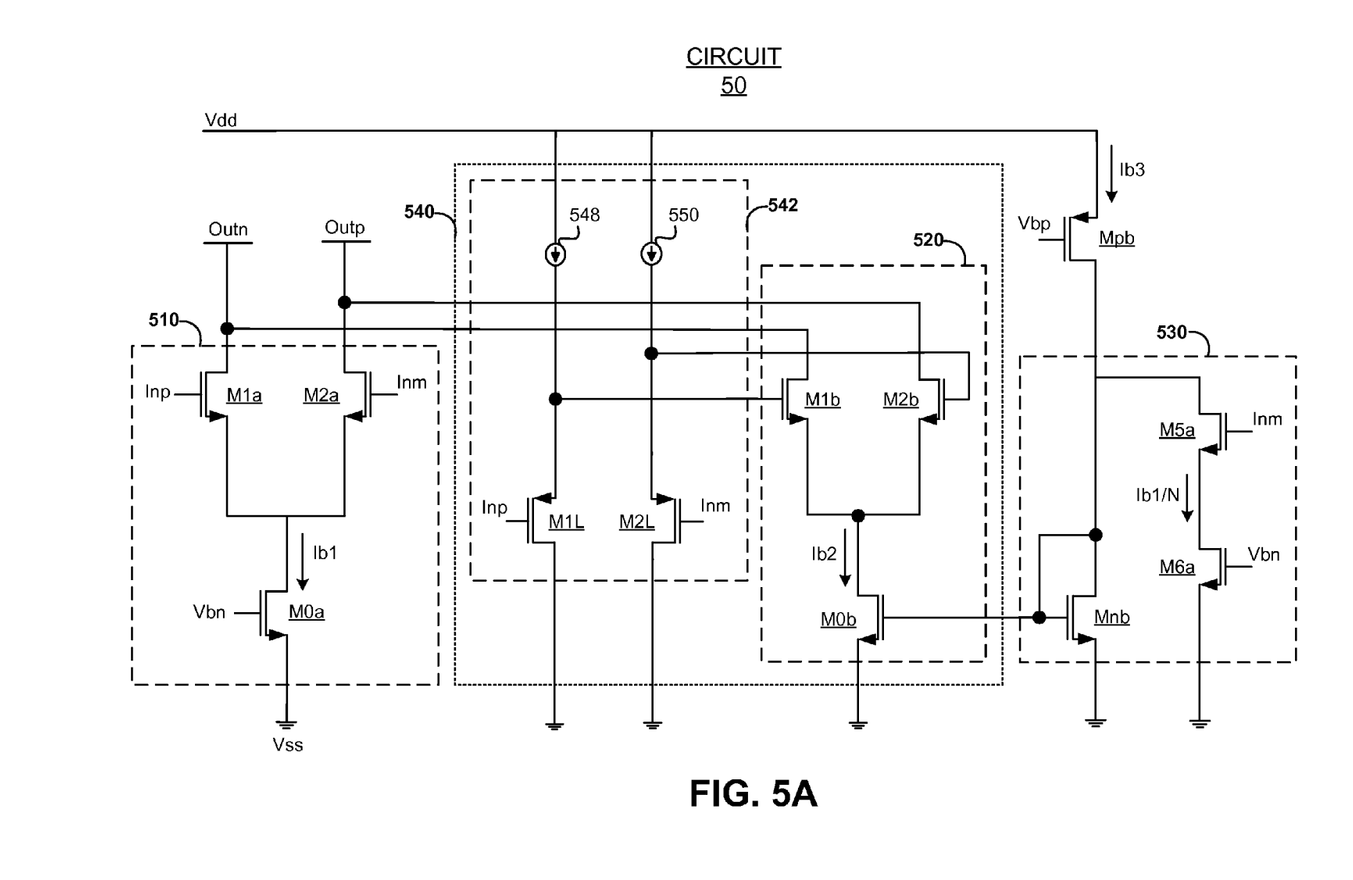
FIG. 5A depicts an example embodiment of a constant-transconductance rail-to-rail input stage circuit utilizing non-complementary differential pairs with a dynamic bias control circuit.

FIG. 5A depicts an example embodiment of a constant-transconductance rail-to-rail input stage circuit utilizing non-complementary differential pairs with a dynamic bias control circuit. In the illustrated embodiment, rail-to-rail input stage circuit 50 comprises a differential pair circuit 510, a level-shifted differential pair circuit 540, and a constant transconductance ("gm") generation circuit 530. As used herein, the differential pair circuit 510 can be referred to as the primary circuit 510 and the level-shifted differential pair circuit 540 can be referred to as the secondary circuit 540.

The current "Ib1" conducting through the primary circuit 510 is active when the input common mode voltage $V_{icm}$ is active, and indeed tracks $V_{icm}$ at the input. The current "Ib2" conducting through the secondary circuit 540, on the other hand, can be gradually shut down according to the techniques discussed below without affecting the performance of the primary circuit 510.

This has the advantage of a faster response time for the rail-to-rail input stage circuit 50. In addition, according to the preferred embodiment described below, the current Ib1 conducting through the primary circuit 510 can be utilized to generate the tail current Ib2 in the secondary circuit 540 in order to maintain a constant gm throughout the input voltage range of the $V_{icm}$ in the rail-to-rail input stage circuit 50.

The rail-to-rail input stage circuit 50 is fully turned on in the entail input common mode voltage range (from $V_{SS}$ up to $V_{DD}$). The differential pair circuit 510 includes a pair of matched NMOS transistors M1a and M2a and a current source NMOS transistor M0a. The level-shifted differential pair circuit 540 comprises a source follower circuit 542 and a differential pair circuit 520. The differential pair circuit 520 includes a pair of matched NMOS transistors M1b and M2b and a current source NMOS transistor M0b. The source follower circuit 542 includes a pair of matched PMOS transistors M1L and M2L coupled with bias current sources 548 and 550 respectively.

Figure 5B:
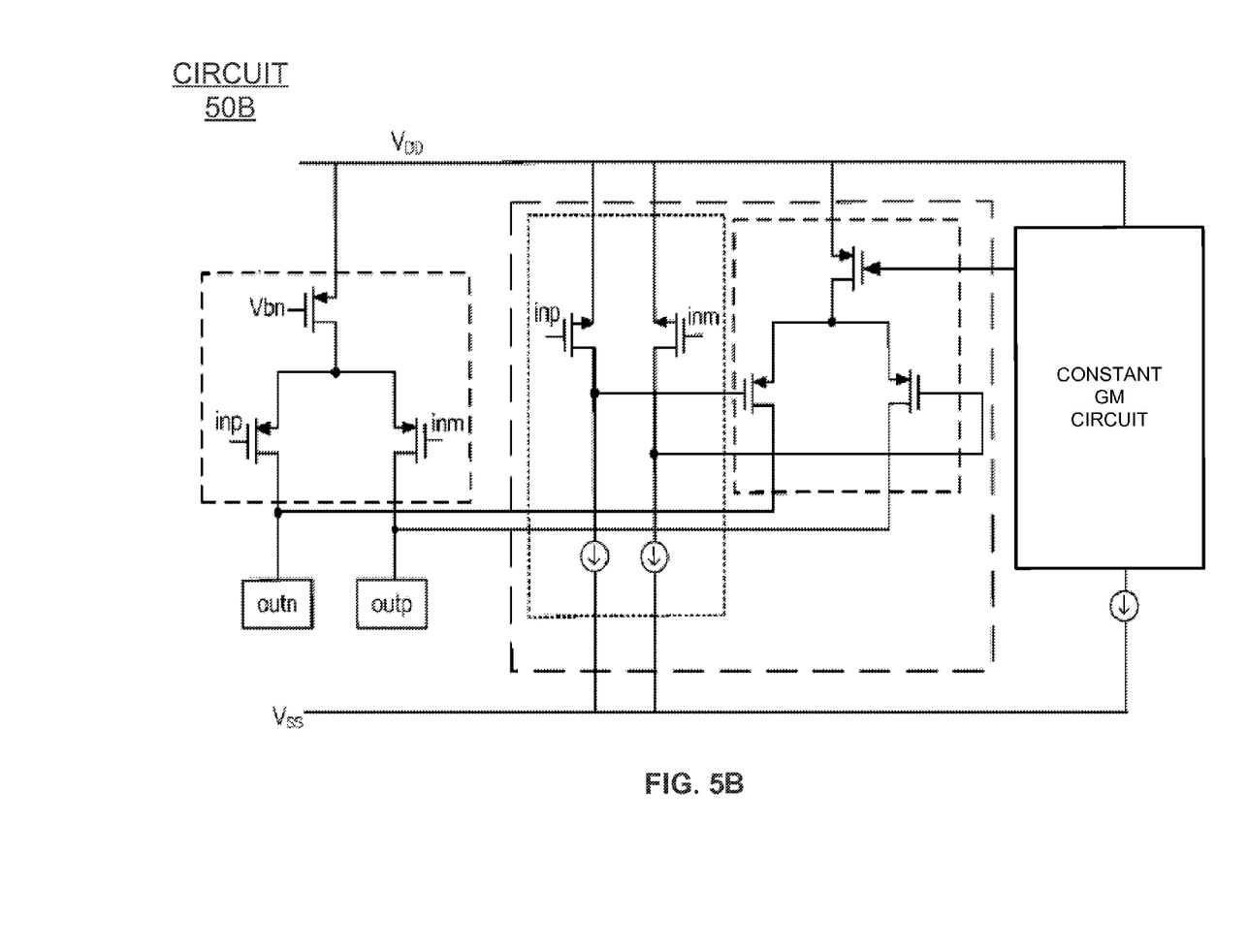
FIG. 5B depicts an example embodiment of a constant-transconductance rail-to-rail input stage circuit utilizing non-complementary differential pairs with a dynamic bias control circuit implemented using PMOS technology.

It should be noted that, although certain embodiments may be described as utilizing MOS transistor technology, the circuit techniques described herein are not limited to any particular transistor technology. It will be appreciated by skilled artisans that other types of transistors or equivalent devices may be used to implement the embodiments described herein. For example, embodiments may be implemented in any type of transistor technology such as MOSFET, JFET, BJT, IGBT, GaAs, etc. In addition, it should further be noted that the solution presented in FIG. 5A is based on NMOS differential pair transistors. Skilled artisans will appreciate that the solution can also be designed using PMOS differential pair transistors as such is a simple design choice for a circuit designer. FIG. 5B depicts an example embodiment of a constant-transconductance rail-to-rail input stage circuit utilizing non-complementary differential pairs with a dynamic bias control circuit implemented using PMOS technology.

The differential pair circuit 510 operates over an input common mode voltage range from $V_{SS}+V_{thn}+2*V_{Dsat}$ to $V_{DD}$, where $V_{thn}$ is the threshold of transistors M1a and M2a, $V_{Dsat}$ is the saturation voltage of the transistors M0a, M1a, and M2a, and $V_{SS}$ and $V_{DD}$ are negative and the positive supply voltages respectively. The differential pair circuit 520 also operates over an input common mode voltage range from $V_{SS}+V_{thn}+2*V_{Dsat}$ to $V_{DD}$.

The source follower circuit 542 is designed to shift up the input voltage level of the rail-to-rail input stage circuit 50 by $V_{thp}+V_{Dsat}$, where $V_{thp}$ is the threshold voltage of transistors M1L and M2L. The level-shifted differential pair circuit 440 has an input common mode voltage that ranges from $V_{SS}+2*V_{Dsat}+V_{thn}-V_{thp}-V_{Dsat\_1s}$ to $V_{DD}-V_{thp}-V_{Dsat}$, where $V_{Dsat\_1s}$ is the saturation voltage of transistors M1L and M2L of the source follower circuit 542.

The differential pair circuit 510 and the level-shifted differential pair circuit 540 are coupled in parallel since they have common input terminals "Inp" and "Inm" and common output terminals "Outp" and "Outn." When $V_{DD}>V_{SS}+V_{thn}+V_{thp}+3*V_{Dsat}$, the rail-to-rail input stage circuit 50 can support an input common mode voltage ranging from the negative supply voltage $V_{SS}$ to the positive supply voltage $V_{DD}$.

The constant gm generation circuit 530 includes a current sensor circuit comprising transistors M5a and M6a and a current mirror circuit comprising transistor Mnb. As shown in the illustrated embodiment, transistor M5a is activated by the input at the common input terminals Inm and transistor M6a is activated by the voltage "Vbn", which is the same input voltage that activates transistor M0a in the primary circuit 510. Vbn is used to provide a bias voltage for transistors M0a and M6a, which can be a fixed voltage or the gate/source terminal of a diode-connected transistor (not shown).

It should be noted that transistor M5a could also be activated by the input at the common input terminal Inp, or the combination of Inm and Imp. The current sensor circuit transistors M5a and M6a attempt to simulate the current Ib1 conducting in the transistor M0a of the primary circuit 510. The current source transistor Mpb receives voltage Vbp at its gate input and provides the necessary bias current Ib3 to the constant gm generation circuit 530. Vbp is used to provide a bias voltage for transistor Mpb, which can be a fixed voltage or the gate/source terminal of a diode-connected transistor (not shown).

In operation, the constant gm generation circuit 530 can be designed to bias the current Ib2 conducting in the current source transistor M0b of the secondary circuit 540 in such a manner so as to maintain a constant transconductance in the circuit 50. The current mirror transistor Mnb in the constant gm generation circuit 530 mirrors part of the bias current Ib3 to control the current Ib2 conducting in the current source transistor M0b in the secondary circuit 540 to achieve constant transconductance in the rail-to-rail input stage circuit 50.

The current Ib2 conducting in the current source transistor M0b in the secondary circuit 540 can be derived from the current Ib1 conducting in the current source transistor M0a in the primary circuit 510. The current sensor circuit defined by transistors M5a and M6a is configured to sense a portion 1/N of the current Ib1 conducting in transistor M0a in the primary circuit 510. The relative device sizes of transistors M0b and Mnb can be selected such that the size of the transistor M0b in the secondary circuit 540 is "N" times greater than the size of the transistor Mnb in the constant gm generation circuit 530, and the relative device sizes of transistors M5a and M6a can be appropriately selected to achieve the sampling fraction of 1/N in the current sensor circuit.

The constant gm generation circuit 530 is designed to subtract the sensed current Ib1/N from a current Ib3 to produce a difference current Ib3–Ib1/N conducting in the current mirror transistor Mnb. The current mirror transistor Mnb of the constant gm generation circuit 530 can mirror this difference current Ib3–Ib1/N to control the current Ib2 conducting through the current source transistor M0b of the secondary circuit 540. When the devices are so sized, the current conducting though the transistor devices M5a and M6a becomes equal to Ib1/N.

Constant transconductance gm can be achieved according to the following equation:

$$Ib2=N*(Ib3-Ib1/N)=N*Ib3-Ib1, \text{ thus } Ib1+Ib2=N*Ib3=\text{constant}$$

Since N is constant and Ib3 is constant, a constant transconductance can be achieved as shown in the equation above. As an example, in the case where N=1, the current conducting through transistors M5a and M6a is equal to Ib1, which is the current conducting through the transistor M0a of the primary circuit 510. As N increases, the current conducting through the transistors M5a and M6a decreases by N times, and Ib3 can also be reduced by N times when compared to the case of N=1. Therefore the current conducting in the transistor Mnb will be Ib3–Ib1/N. By designing the device size W/L (where W is the transistor channel width and L is the transistor channel length) of transistor M0b to be N times larger than the device size of transistor Mnb, the current Ib2 conducting in the current source transistor M0b of the secondary circuit 540 will be N*(Ib3−Ib1/N)=N*Ib3−Ib1. Thus, Ib1+Ib2=N*Ib3=constant.

As another example, when N=4, the current conducting in the current sensor transistors M5a and M6a is equal to Ib1/4 and the current Ib2 conducting in the current source transistor M0b of the level-shifted differential pair circuit 540 is equal to 4*Ib3−Ib1 under the condition when the device size of M0b is 4 times larger than the size of Mnb. Therefore, Ib1+Ib2=4*Ib3=constant.

As a further example, the constant gm generation circuit 50 can be designed with Ib1_desired=N*Ib3. As long as $V_{icm}$ is inside the range (i.e., $V_{icm} > V_{SS}+V_{thn}+2*V_{Dsat}$) supported by the first (primary) differential pair circuit 510, then the current source transistor M0a will be fully turned on and conducting current Ib1=Ib1_desired. Therefore current conducting in the current sensor transistors M5a and M6a is equal to Ib1_desired/N=Ib3. In such a case, there is no current conducting in transistors Mnb and M0b (i.e., Ib2=0), Thus, the level-shifted differential pair circuit 520 does not conduct any current even under the condition of $V_{icm}$ is also inside the range supported by the level-shifted differential pair. So Ib1+Ib2=Ib1_desired+0=N*Ib3=constant. Always fully turning on the first differential pair when $V_{icm}$ is within its supported range is highly desired because the first differential pair has a faster speed, and less offset and noise when compared to the level-shifted differential pair.

When $V_{icm}$ is slightly outside the range (i.e., $V_{icm} < V_{SS}+V_{thn}+2*V_{Dsat}$) supported by the first differential pair circuit 510, then the current source transistor M0a cannot be fully turned on and conducting current Ib1 is less than Ib1_desired. Therefore the current conducting in the current sensor transistors M5a and M6a that is equal to Ib1/N will be less than Ib1_desired. In this case, current conducting in transistor Mnb will be Ib3−Ib1/N, while current conducting in transistor M0b will be N*Ib3−Ib1. Thus, the level-shifted differential pair circuit 540 starts to conduct current. Again, Ib1+Ib2=Ib1+N*Ib3−Ib1=N*Ib3=constant.

Therefore the rail-to-rail input stage circuit 50 can maintain a constant transconductance. When $V_{icm}$ is much lower than $V_{SS}+V_{thn}+2*V_{Dsat}$, there will be no current in M0a (i.e., Ib1=0) meaning the first differential pair is turned off. Therefore there is no current in the current sensor transistors M5a and M6a. The current conducting in transistor Mnb will be Ib3, so the current conducting in transistor M0b will be N*Ib3. Therefore a constant transconductance can still be maintained because the equation, Ib1+Ib2=0+N*Ib3=N*Ib3=constant, still holds true.

This configuration does not allow transistors M1b and M2b to enter into the ohmic region (linear region), and thus does not allow reduction in the overall output impedance of the circuit 50—and consequently the gain—of rail-to-rail input stage circuit 50.

II. Exemplary Processes

The processes described below are exemplary in nature and are provided for illustrative purposes and not intended to limit the scope of the embodiments described herein to any particular example embodiment. For instance, methods in accordance with some embodiments may include or omit some or all of the operations described below, or may include steps in a different order than described herein. The particular methods described are not intended to be limited to any particular set of operations exclusive of all other potentially intermediate operations.

In addition, the operations may be embodied in computer-executable code, which causes a general-purpose or special-purpose computer to perform certain functional operations. In other instances, these operations may be performed by specific hardware components or hardwired circuitry, or by any combination of programmed computer components and custom hardware circuitry.

Figure 6:
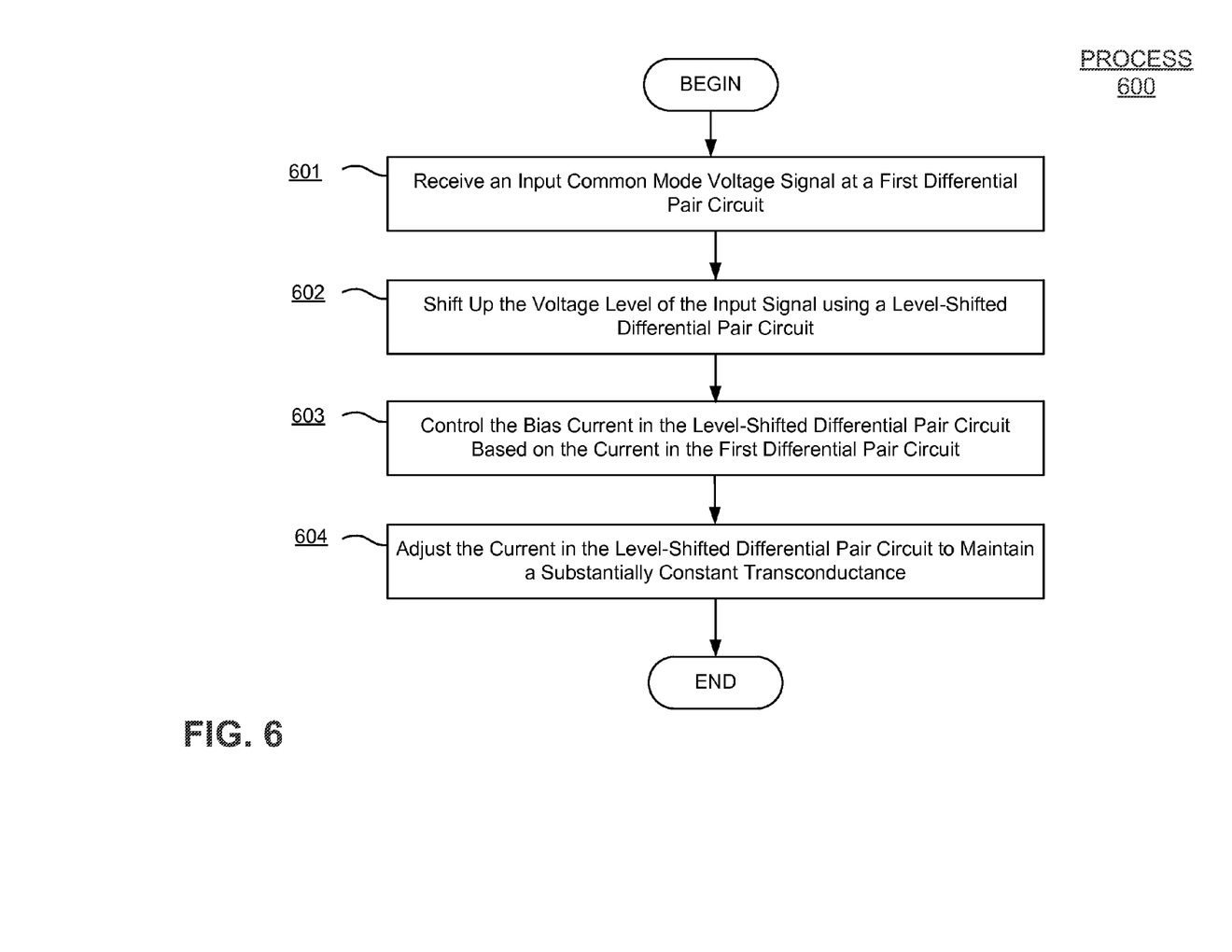
FIG. 6 depicts an example embodiment of a process for maintaining a constant transconductance in a rail-to-rail input stage circuit utilizing non-complementary differential pairs with dynamic bias control.

FIG. 6 depicts an example embodiment of a process for maintaining a constant-transconductance in a rail-to-rail input stage circuit utilizing non-complementary differential pairs with dynamic bias control. In the illustrated embodiment, process 600 begins at operation 601 by receiving an input signal having a common mode voltage range at a first differential pair circuit having a first pair of matched transistors and a first current source transistor. Process 600 continues by shifting up the voltage level of the input signal using a level-shifted differential pair circuit coupled with the first differential pair circuit (operation 602). The level-shifted differential pair circuit has an input common mode voltage range extending from a negative power supply voltage to a positive power supply voltage.

Process 600 is further configured for controlling bias of current conducting in the level-shifted differential pair circuit based on current conducting in the first differential pair circuit (operation 603). In one embodiment, the level-shifted differential pair circuit includes a source follower circuit and a second differential pair circuit. The second differential pair circuit includes a second pair of matched transistors and a second current source transistor. The constant transconductance generation circuit includes a current sensor circuit for generating a tracking current proportional to a sensed input common mode voltage of the rail-to-rail input stage circuit and a current mirror circuit comprising a transistor device having its gate and drain terminals coupled with the current sensor circuit and the second current source transistor of the level-shifted differential pair to control bias of current conducting in the second current source transistor of the level-shifted differential pair circuit in response to the tracking current.

Process 600 continues at operation 604 by adjusting the current conducting in the second differential pair circuit to maintain the transconductance of the rail-to-rail input stage circuit substantially constant over the entail input common mode voltage range. Using this process, the current conducting in the level-shifted differential pair circuit can be curtailed in response to the input common mode voltage, and gradually turned off when the input common mode voltage is inside the input common mode voltage range supported by the first differential pair circuit. The device size of the second current source transistor in the level-shifted differential circuit can be designed to be "N" times greater than the device size of the current mirror transistor in the constant transconductance generation circuit. And the device sizes of the transistors in the current sensor circuit can be selected to produce a tracking current equal to 1/N times current conducting in the first differential pair circuit.

A difference current can then be mirrored to the second current source transistor of the level-shifted differential pair circuit. The difference current can be obtained by subtracting current conducting in the current sensor circuit from a constant current source supplying current to the constant transconductance generation circuit to produce the difference current. This completes process 600 according to one example embodiment.

III. Advantages

The proposed solution is therefore capable of curtailing the current flow in the level-shifted differential pair circuit 540 when the input common mode voltage is inside the input common mode voltage range supported by the first differential pair circuit. This has a numerous advantages over the prior art techniques. First, the proposed solution avoids the use of a cascode stage at the output of the level shifted differential pair in order to maintain high output impedance when the input common mode voltage is near the positive supply. This is advantageous for low voltage operation, as the use of a cascode stage requires a higher supply voltage than a typical differential pair circuit.

The proposed solution also avoids the use of current steering techniques based on current sources that use stacked transistor devices, and is therefore suitable for low power supply operation. In addition, the proposed solution also achieves constant total bias current (i.e., Ib1+Ib2) for the primary N-pair circuit and the secondary N-pair circuit. A constant gm can therefore be achieved over a wider supply range than prior art solutions.

The proposed solution provides less power consumption, better matching, better power supply rejection ration ("PSRR"), and requires less die area than the prior art solutions. The power consumption is very low because the total current is kept constant regardless of the common mode input voltage and supply voltage. The primary N-pair is always fully turned on as long as the common mode input voltage is high enough (i.e., $V_{icm} > V_{SS} + V_{thn} + 2*V_{Dsat}$), while the secondary N-pair only turns on when the primary N-pair is running out of (i.e., $V_{icm} < V_{SS} + V_{thn} + 2*V_{Dsat}$).

The primary N-pair does not need to use the level-shifted differential pair circuit, and therefore intrinsically has faster speed and lower offset. The circuit techniques described herein can operate at higher speeds because they make full use of the primary (fast) N-pair, which has a faster response than the secondary N-pair. Furthermore, the proposed input stage operation point (especially the bias current in each N-pair) is not sensitive to power supply voltage changes. Therefore, a more robust circuit, with tighter gm control and higher power supply rejection can be achieved.

Figure 7:
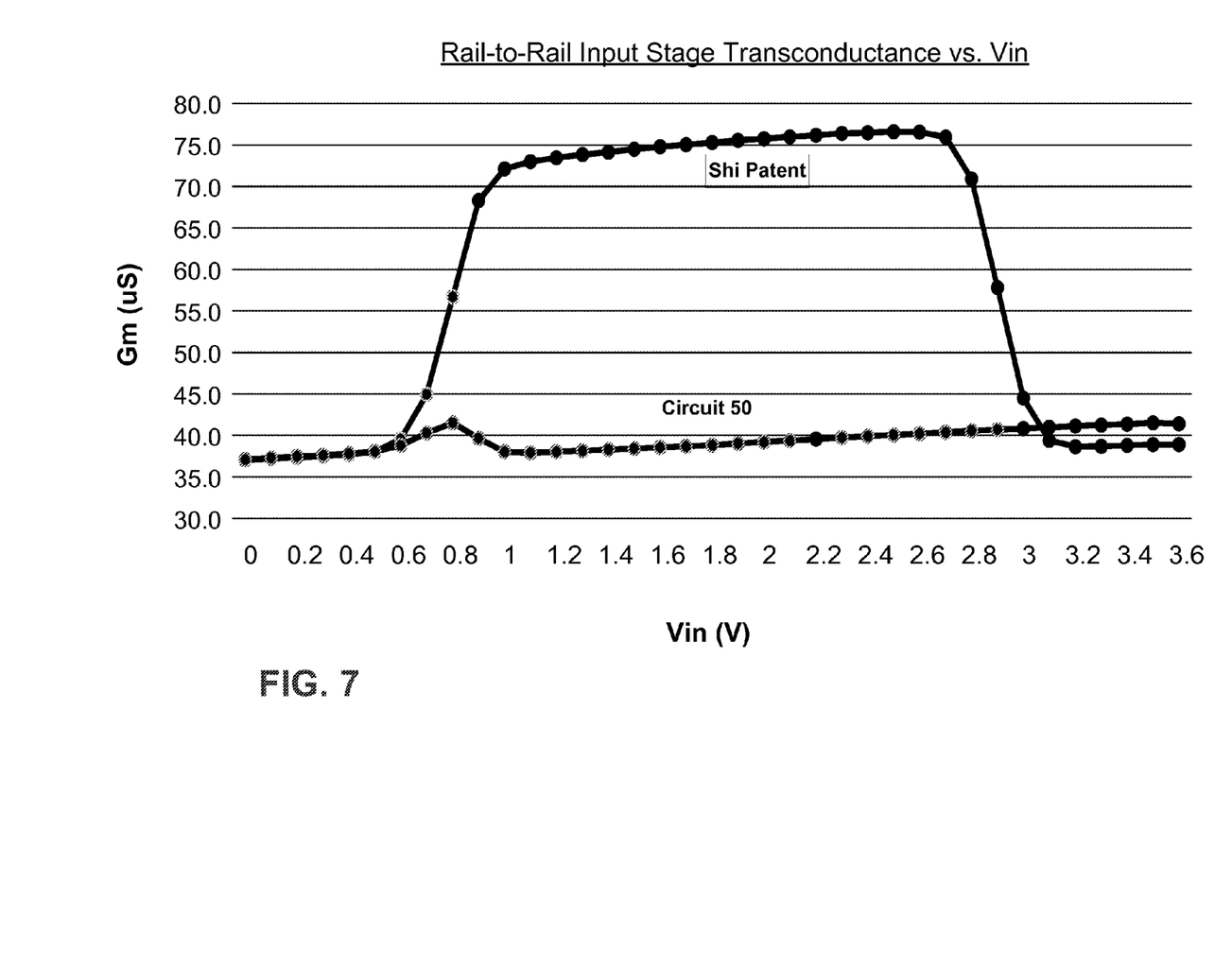
FIG. 7 depicts an example simulated transconductance (μS) of the rail-to-rail input stage circuit versus the input common-mode voltage Vin for the exemplary embodiment of FIG. 5 compared with the one disclosed in the Shi Patent of FIG. 4.

FIG. 7 depicts an example simulated transconductance (μS) of the rail-to-rail input stage circuit versus the input common-mode voltage Vin for the exemplary embodiment of FIG. 5A compared with the one disclosed in the Shi Patent of FIG. 4. As can be seen from FIG. 7 and Table 1 below, the transconductance variation is less than 6% over the entire common-mode voltage range. The circuit techniques described herein can reduce the transconductance gm variation by six times. In this example, the simulated transconductance was swept through Vin from 0V to 3.6V with a step size of 100 mV.

TABLE 1

| Topology | Min gm (μS) | Max gm (μS) | gm variation (%) |
| --- | --- | --- | --- |
| Prior art | 37.0 | 76.6 | ±34.9 |
| This invention | 37.1 | 41.5 | ±5.6 |

Figure 8:
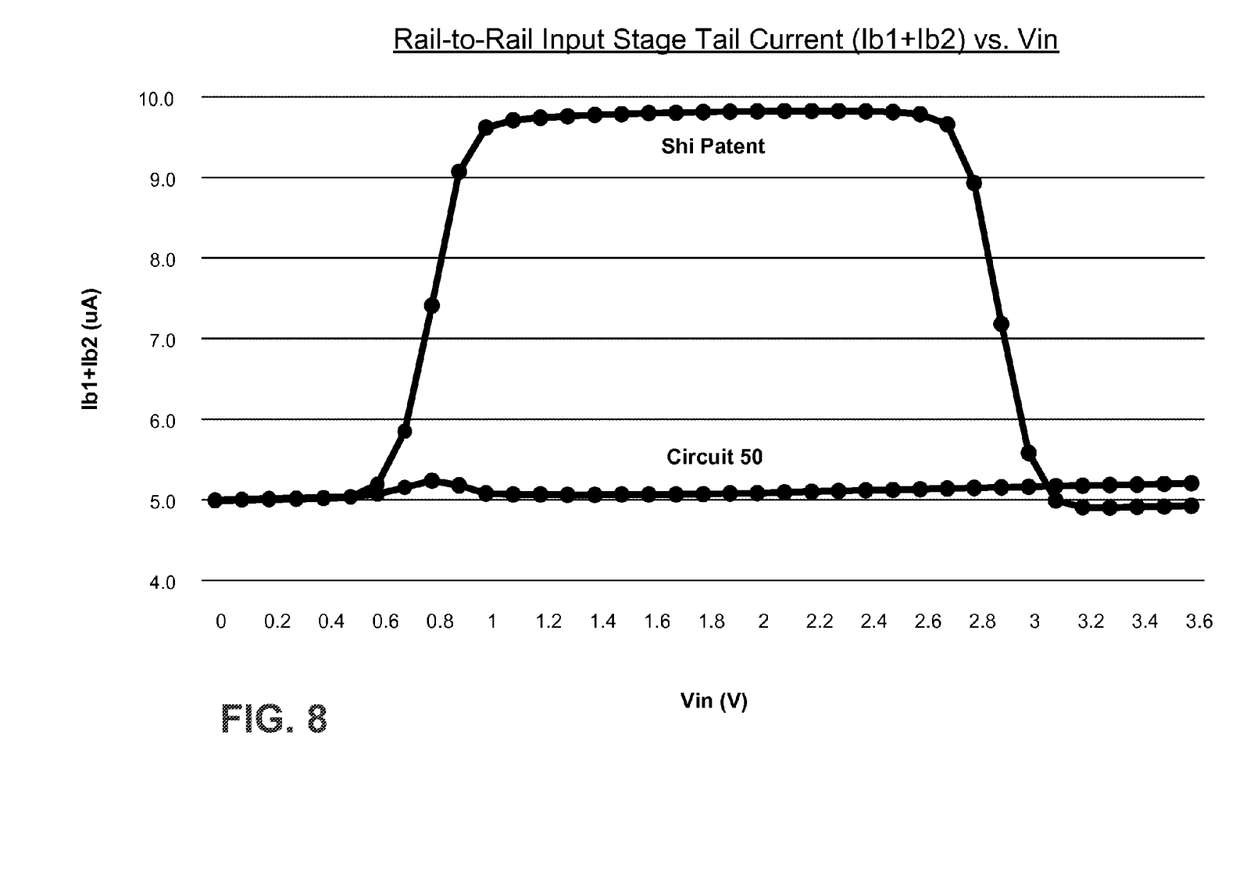
FIG. 8 depicts an example simulated tail current Ib1+Ib2 (μA) of the rail-to-rail input stage circuit versus the input common-mode voltage Vin for the exemplary circuit embodiment of FIG. 5 compared with the one disclosed in the Shi Patent of FIG. 4.

FIG. 8 shows a simulated tail current Ib1+Ib2 (μA) of the rail-to-rail input stage circuit versus the input common-mode voltage Vin for the exemplary circuit embodiment of FIG. 5A compared with the one disclosed in the Shi Patent of FIG. 4. As can be seen from FIG. 8 and Table 2 below, the tail current Ib1+Ib2 variation is less than 2% over the entire common-mode voltage range. The circuit techniques described herein can reduce the tail current variation by 16 times. In this example, the simulation was swept through Vin from 0V to 3.6V with a step size of 100 mV.

TABLE 2

| Topology | Min Ib1 + Ib2 (μA) | Min Ib1 + Ib2 (μA) | Ib1 + Ib2 variation (%) |
|---|---|---|---|
| Prior art | 4.9 | 9.8 | ±33 |
| Circuit 50 | 5.0 | 5.2 | ±2 |

Those of skill would further appreciate that the various illustrative logical blocks, modules, circuits, and algorithm steps described in connection with the embodiments disclosed herein may be implemented as electronic hardware, computer software, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments described herein.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine, etc. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled with the processor such that the processor can read information from, and write information to, the storage medium. In the alternative, the storage medium may be integrated into the processor.

To the extent the embodiments described herein are implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

Throughout the foregoing description, for the purposes of explanation, numerous specific details were set forth in order to provide a thorough understanding of the invention. It will be apparent, however, to persons skilled in the art that these embodiments may be practiced without some of these specific details. The above examples and embodiments should not be deemed to be the only embodiments, and are presented to illustrate the flexibility and advantages of the present invention. Other arrangements, embodiments, implementations and equivalents will be evident to those skilled in the art and may be employed without departing from the spirit and scope of the invention as defined by the following claims.

What is claimed is:

1. A rail-to-rail input stage circuit comprising:
   a first differential pair circuit comprising a first pair of matched transistors having control terminals coupled to a pair of input terminals and a first current source transistor;
   a level-shifted differential pair circuit coupled with the first differential pair circuit, the level-shifted differential pair circuit having control terminals coupled to the pair of input terminals; and
   a constant transconductance generation circuit coupled with the level-shifted differential pair circuit, the constant transconductance generation circuit comprising:
      a first transistor having a control terminal coupled to a control terminal of the first current source transistor in the first differential pair circuit to produce a current through the first transistor corresponding to a current in the first differential pair circuit;
      a second transistor configured in series with the first transistor to receive the current in the first transistor and having a control terminal coupled to a voltage based on one or more voltages on the pair of input terminals; and
      a current mirror transistor having a first terminal configured to receive a bias current and the current in the first and second transistors, the current mirror transistor configured to mirror a second current to the level-shifted differential pair circuit, wherein the second current is based on a difference between the bias current and the current in the first and second transistors.

2. The rail-to-rail input stage circuit of claim 1 wherein the level-shifted differential pair circuit comprises a source follower circuit and a second differential pair circuit, and wherein the second differential pair circuit comprises a second pair of matched transistors and a second current source transistor, wherein the second current source transistor is coupled to the current mirror transistor to form a current mirror.

3. The rail-to-rail input stage circuit of claim 2 wherein the constant transconductance generation circuit is adapted to adjust current conducting in the second differential pair circuit to maintain the transconductance of the rail-to-rail input stage circuit substantially constant over an entire input common mode voltage range.

4. The rail-to-rail input stage circuit of claim 1 wherein the constant transconductance generation circuit is configured to curtail current conducting in the level-shifted differential pair circuit in response to a current conducting in the first differential pair circuit.

5. The rail-to-rail input stage circuit of claim 4 wherein the constant transconductance generation circuit is configured to turn off the current conducting in the level-shifted differential pair circuit when a common mode voltage on the pair of input terminals is supported by the first differential pair circuit.

6. The rail-to-rail input stage circuit of claim 2 wherein a device size of the second current source transistor in the level-shifted differential circuit is N times greater than a device size of the current mirror transistor in the constant transconductance generation circuit.

7. A method in a rail-to-rail input stage circuit comprising;
receiving an input signal at a first differential pair circuit comprising a first pair of matched transistors having control terminals coupled to a pair of input terminals and a first current source transistor;
shifting up the voltage level of the input signal using a level-shifted differential pair circuit coupled with the first differential pair circuit, the level-shifted differential pair circuit having control terminals coupled to the pair of input terminals;
generating a substantially constant transconductance in the rail-to-rail input stage circuit using a constant transconductance generation circuit, the constant transconductance generation circuit:
generating a current through a first transistor corresponding to a current in the first differential pair circuit, the first transistor having a control terminal coupled to a control terminal of the first current source transistor in the first differential pair circuit;
receiving the current through the first transistor in a second transistor, the second transistor configured in series with the first transistor and having a control terminal coupled to a voltage based on one or more voltages on the pair of input terminals; and
mirroring a second current through a current mirror transistor to the level-shifted differential pair circuit, the current mirror transistor having a first terminal coupled to a bias current and the current in the first and second transistors, wherein the second current is based on a difference between the bias current and the current in the first and second transistors.

8. The method of claim 7 wherein the level-shifted differential pair circuit comprises a source follower circuit and a second differential pair circuit, and wherein the second differential pair circuit comprises a second pair of matched transistors and a second current source transistor, wherein the second current source transistor is coupled to the current mirror transistor to form a current mirror.

9. The method of claim 8 further comprising adjusting current conducting in the second differential pair circuit to maintain the transconductance of the rail-to-rail input stage circuit substantially constant when a common mode voltage on the pair of input terminals is not supported by the first differential pair circuit.

10. The method of claim 7 further comprising curtailing current conducting in the level-shifted differential pair circuit in response to a current conducting in the first differential pair circuit.

11. The method of claim 10 further comprising turning off current conducting in the level-shifted differential pair circuit when a common mode voltage is supported by the first differential pair circuit.

12. The method of claim 8 wherein a device size of the second current source transistor in the level-shifted differential circuit is N times greater than a device size of the current mirror transistor in the constant transconductance generation circuit.

13. A rail-to-rail input stage circuit comprising;
means for receiving an input signal at a first differential pair circuit comprising a first pair of matched transistors having control terminals coupled to a pair of input terminals and a first current source transistor;
means for shifting up the voltage level of the input signal using a level-shifted differential pair circuit coupled with the first differential pair circuit, the level-shifted differential pair circuit having control terminals coupled to the pair of input terminals;
means for generating a substantially constant transconductance in the rail-to-rail input stage circuit using a constant transconductance generation circuit, the constant transconductance generation circuit comprising:
means for generating a first current corresponding to a current in the first differential pair circuit;
means for coupling the first current configured in series with the means for generating the first current, said means for coupling the first current being activated by a voltage based on one or more voltages on the pair of input terminals; and
means for mirroring a second current to the level-shifted differential pair circuit, wherein the second current is based on a difference between a bias current and the first current from the means for coupling the first current.

* * * * *